(12) United States Patent
Yu

(10) Patent No.: US 6,458,662 B1
(45) Date of Patent: Oct. 1, 2002

(54) METHOD OF FABRICATING A SEMICONDUCTOR DEVICE HAVING AN ASYMMETRICAL DUAL-GATE SILICON-GERMANIUM (SIGE) CHANNEL MOSFET AND A DEVICE THEREBY FORMED

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/826,551

(22) Filed: Apr. 4, 2001

(51) Int. Cl.$^7$ ............................................. H01L 21/336

(52) U.S. Cl. ..................... 438/286; 438/303; 438/304; 438/752; 438/149; 438/268

(58) Field of Search ..................... 438/299–306, 438/149, 164, 752, 933, 286, 268

(56) References Cited

U.S. PATENT DOCUMENTS 6,200,866 B1 * 3/2002 Ma et al. ..................... 438/299

* cited by examiner

*Primary Examiner*—Jey Tsai
(74) *Attorney, Agent, or Firm*—LaRiviere, Grubman & Payne, LLP

(57) ABSTRACT

A method of fabricating a semiconductor device, having an asymmetrical dual-gate MOSFET with a silicon-germanium (SiGe) channel, involving: patterning a silicon-on-insulator (SOI) wafer with a photoresist layer, wherein the SOI structure comprises a silicon dioxide ($SiO_2$) layer, a silicon (Si) layer deposited on the $SiO_2$ layer, and a silicon nitride ($Si_3N_4$) layer deposited on the Si layer; initiating formation of a SiGe/Si/SiGe sandwich fin structure from the SOI structure; completing formation of the SiGe/Si/SiGe sandwich fin structure; depositing a thick gate material layer on the SiGe/Si/SiGe sandwich fin structure; forming an asymmetrical dual-gate; and completing fabrication of the semiconductor device, and a device thereby formed.

19 Claims, 2 Drawing Sheets

Figure 1:
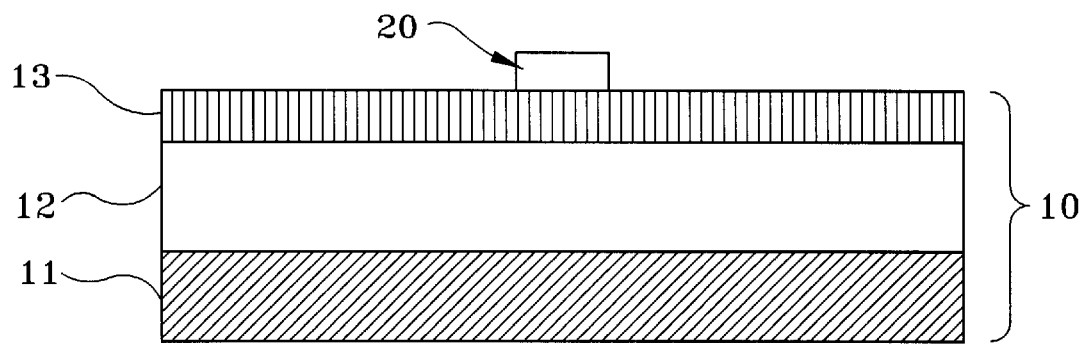

METHOD OF FABRICATING A SEMICONDUCTOR DEVICE HAVING AN ASYMMETRICAL DUAL-GATE SILICON-GERMANIUM (SIGE) CHANNEL MOSFET AND A DEVICE THEREBY FORMED

CROSS-REFERENCE TO RELATED APPLICATION(S)

Not Applicable.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

1. Field of the Invention

The present invention relates to semiconductor devices and their methods of fabrication. More particularly, the present invention relates to the formation of complimentary metal oxide semiconductor field effect transistors (MOSFETs). Even more particularly, the present invention relates to forming MOSFETs using differential silicides.

2. Description of the Background Art

Currently, a double-gate silicon-on-insulator metal oxide semiconductor field effect transistor (SOI MOSFET) is receiving significant attention in the semiconductor industry due to its high current drive and high immunity to short-channel effects. As such, the dual-gate SOI MOSFET is a good candidate architecture for sub-0.25-$\mu$m gate length complementary metal oxide semiconductor (CMOS) technology. A dual-gate Fin-FET comprises an active layer being surrounded by a gate on both sides of a narrow silicon "fin." However, only one gate electrode straddles across the silicon "fin" or active line. In some applications, a separate gate electrode may be required. By individually biasing two such gates (i.e., applying an "asymmetrical gate"), the threshold voltage of a MOSFET is more readily controllable. Dual-gate biasing of a transistor also potentially reduces standby power and/or improves on-state drive current through a "threshold dynamic voltage" design. However, these related art dual gates have limited carrier mobility (speed at which an electron or a hole can move). Therefore, a need exists for a method of fabricating a semiconductor device having an asymmetrical dual-gate MOSFET with a channel which improves carrier mobility.

BRIEF SUMMARY OF THE INVENTION

Accordingly, the present invention provides a method of fabricating a semiconductor device having an asymmetrical dual-gate MOSFET with a silicon-germanium (SiGe) channel which improves carrier mobility, and a device thereby formed. Generally, the present invention device comprises a SiGe channel, which provides approximately 2 to 5 times more carrier mobility (especially with "holes") than a related Si channel, because the present SiGe channel reduces carrier scattering and has a substantially lighter effective mass of "holes." The present invention method for fabricating the present device, generally comprises: forming a dual-gate MOSFET having a SiGe/Si/SiGe sandwich structure; and forming a pair of asymmetrical gate electrodes. The unique features of the present method basically involve forming an epitaxial layer, comprising SiGe, on at least one sidewall of a narrow line, comprising Si; depositing a gate electrode material over the narrow line and the epitaxial layer; and polishing the gate electrode material, and thereby forming the pair of asymmetrical gate electrodes. This present invention dual-gate device, so formed, has the advantages of both a high drive current as well as a high immunity to short-channel effect (SCE), enabling further densification of transistors and circuits.

By way of example, and not of limitation, a semiconductor device, having an asymmetrical dual-gate MOSFET with a silicon-germanium (SiGe) channel, may be fabricated according to the present invention by: (a) patterning an active region of a silicon-on-insulator (SOI) structure (or wafer) with a first photoreist layer, wherein the SOI structure comprises a silicon dioxide ($SiO_2$) layer, a silicon (Si) layer deposited on the $SiO_2$ layer, and a silicon nitride ($Si_3N_4$) layer deposited on the Si layer; (b) initiating formation of a SiGe/Si/SiGe sandwich fin structure from the SOI structure, wherein the step (b) comprises (b)(1) etching through the $Si_3N_4$ and the Si layers, thereby forming a $Si_3N_4$/Si stack, the $Si_3N_4$/Si stack comprising a $Si_3N_4$ cap layer and a reduced width Si layer, wherein the $Si_3N_4$/Si stack has a height in a range of approximately 800 Angstroms to approximately 1500 Angstroms, and (b)(2) further etching the Si layer by wet-etching, thereby forming a narrow line, comprising Si, under the $Si_3N_4$ cap layer; (c) completing formation of the SiGe/Si/SiGe sandwich fin structure, wherein the step (c) comprises (c)(1) forming an epitaxial layer, comprising SiGe, on at least one sidewall of the narrow line, and (c)(2) depositing a thin gate dielectric layer, wherein the thin gate dielectric layer comprises a high dielectric constant material such as $Si_3N_4$; (d) depositing a thick gate material layer on SiGe/Si/SiGe sandwich fin structure, wherein the thick gate material layer has a thickness in a range of approximately 3000 Angstroms to approximately 6000 Angstroms, and wherein the thick gate material layer comprises a material selected from a group consisting essentially of polysilicon (poly-Si), poly-SiGe, and a metal; and (e) forming an asymmetrical dual gate, wherein the step (e) comprises (e)(1) polishing the gate material, thereby forming a polished gate material, whereby the $Si_3N_4$ cap layer acts as a polishing-stop, wherein the polishing step (e)(1) may be performed by a technique such as chemical-mechanical polishing (CMP), (e)(2) patterning the polished gate material with a second photoreist layer; (e)(3) etching the patterned polished gate material, thereby forming a pair of asymmetrical gate electrodes, and (e)(4) completing processing of the asymmetrical gate electrodes, thereby forming the asymmetrical dual-gate, wherein the asymmetrical dual gate is separated by the $Si_3N_4$ cap layer; and (f) completing fabrication of the semiconductor device (e.g., formation of source/drain structure).

An object of the present invention is to reduce carrier scattering and provide a substantially lighter effective mass of "holes" in a MOSFET.

Another object of the present invention is to provide a method for fabricating a semiconductor device, having an asymmetrical dual-gate MOSFET with a silicon-germanium (SiGe) channel which improves carrier mobility.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWING(S)

For a better understanding of the present invention, reference is made to the below-referenced accompanying drawing(s) which is/are for illustrative purposes and where like reference numbers denote like elements.

FIG. 1 through FIG. 6, together, constitute a process flow diagram of the fabrication of a semiconductor device, in accordance with the present invention, wherein the semiconductor device is shown in cross-section at various stages of the process.

DETAILED DESCRIPTION OF THE INVENTION

Referring more specifically to the drawings for illustrative purposes, the present invention is embodied in the apparatus and method generally shown in FIG. 1 through FIG. 6. These figures depict an embodiment of a process for fabricating a semiconductor device, having an asymmetrical dual-gate MOSFET with a silicon-germanium (SiGe) channel which improves carrier mobility. Each figure illustrates a particular processing stage, and presents a side view in cross-section of the device at that stage of processing. However, that the apparatus may vary as to configuration and as to details of the parts, and that the method may vary as to the specific steps and sequence, without departing from the basic concepts as disclosed herein, will be appreciated.

Referring first to FIG. 1, in the first stage of processing, an active region of a silicon-on-insulator (SOI) structure (or wafer) 10 is patterned with a first photoreist layer 20, wherein the SOI structure 10 may comprise a silicon dioxide ($SiO_2$) layer 11, a silicon (Si) layer 12 is deposited on the $SiO_2$ layer 11, and a silicon nitride ($Si_3N_4$) layer 13 is deposited on the Si layer 12.

Figure 2:
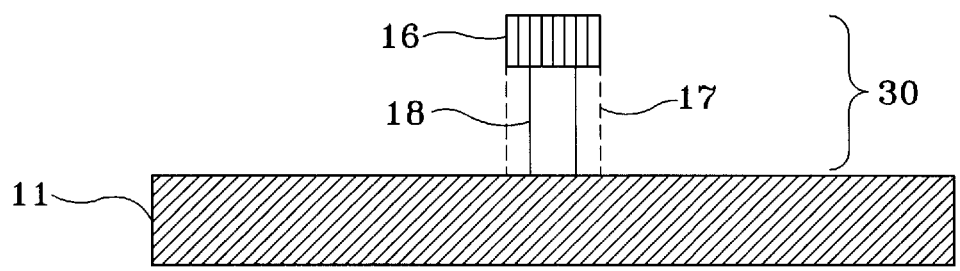

Next, as shown in FIG. 2, an initial SiGe/Si/SiGe sandwich fin structure 30 is formed from the SOI structure 10, wherein the SiGe/Si/SiGe sandwich fin structure 30 is initially formed by etching through the $Si_3N_4$ layer 13 and the Si layer 12, thereby forming a $Si_3N_4$/Si stack 15, the $Si_3N_4$/Si stack comprising a $Si_3N_4$ cap layer 16 and a reduced width Si layer 17, and wherein the $Si_3N_4$/Si stack may have a height in a range of approximately 800 Angstroms to approximately 1500 Angstroms, and by further etching the reduced width Si layer 17 by wet-etching, thereby forming a narrow line 18, comprising Si, under the $Si_3N_4$ cap layer 16.

Figure 3:
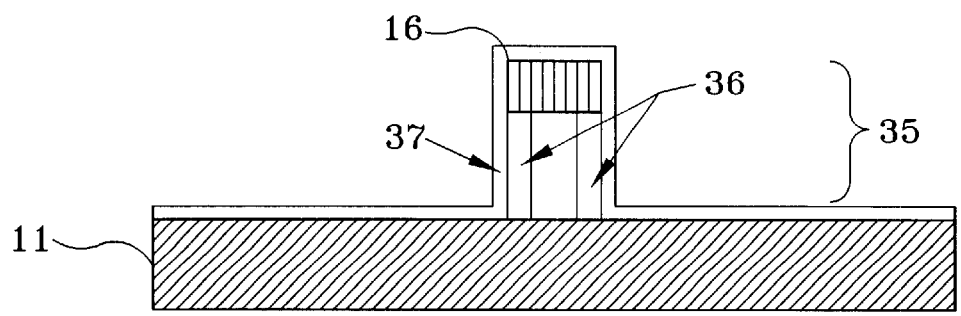

Next, as shown in FIG. 3, a complete SiGe/Si/SiGe sandwich fin structure 35 is formed on the $SiO_2$ layer 11, wherein the complete SiGe/Si/SiGe sandwich fin structure 35 is finally formed by forming an epitaxial layer 36, comprising SiGe, on at least one sidewall of the narrow line, and by depositing a thin gate dielectric layer 37 on the epitaxial layer 36, the cap layer 16, and any exposed portion of the $SiO_2$ layer 11, wherein the thin gate dielectric layer 37 may comprise a high dielectric constant material such as $Si_3N_4$.

Figure 4:
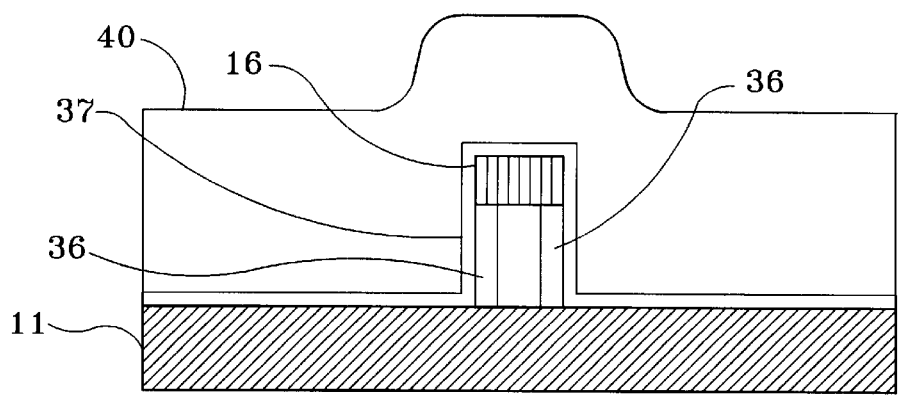

Next, as shown in FIG. 4, a thick gate material layer 40 is deposited on the thin gate dielectric layer 37 (i.e., over the complete SiGe/Si/SiGe sandwich fin structure 35), wherein the thick gate material layer 40 may have a thickness in a range of approximately 3000 Angstroms to approximately 6000 Angstroms, and wherein the thick gate material layer 40 may comprise a material selected from a group consisting essentially of polysilicon (poly-Si), polysilicon-germanium (poly-SiGe), and a metal.

Figure 5:
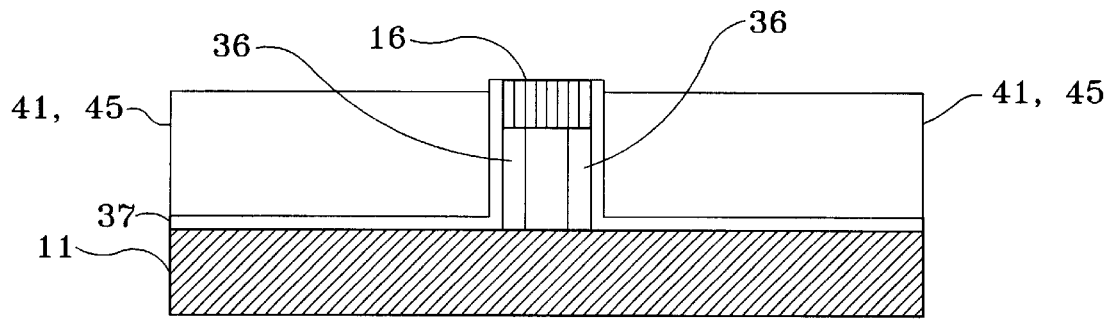

Next, as shown in FIG. 5, an asymmetrical dual-gate 45 is formed, wherein the asymmetrical dual-gate 45 is formed by polishing the gate material 40, thereby forming a polished gate material 41, whereby the $Si_3N_4$ cap layer 16 acts as a polishing-stop, wherein the polishing step may be performed by a technique such as chemical-mechanical polishing (CMP); by patterning the polished gate material 41 with a second photoresist layer (not shown); by etching the patterned polished gate material 41, thereby forming a pair of asymmetrical gate electrodes; and by completing processing of the asymmetrical gate electrodes, thereby forming the asymmetrical dual-gate 45, wherein each gate of the asymmetrical dual-gate 45 is separated by the $Si_3N_4$ cap layer.

Figure 6:
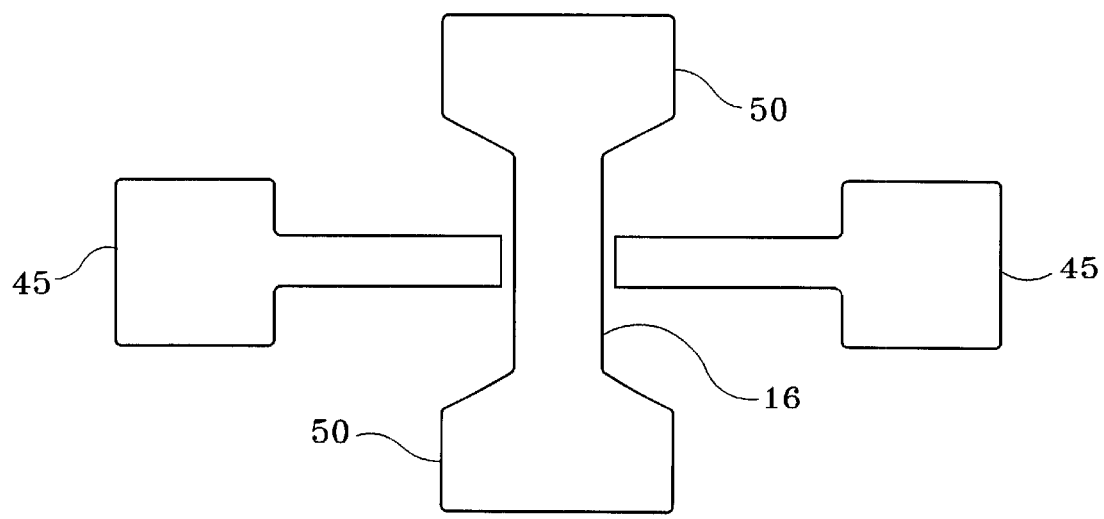

As depicted in FIG. 6, a source/drain structure 50 is formed in the substrate 10, wherein the source/drain structure 50 is disposed adjacent to the complete SiGe/Si/SiGe sandwich fin structure 35, and wherein the asymmetrical dual-gate 45 flanks the complete SiGe/Si/SiGe sandwich fin structure 35 and is disposed approximately 90° from the source/drain structure 50.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. 112, sixth paragraph, unless the element is expressly recited using the phrase "means for."

What is claimed:

1. A method of fabricating a semiconductor device, having an asymmetrical dual-gate MOSFET with a silicon-germanium (SiGe) channel, comprising:

forming an epitaxial SiGe layer on at least one sidewall of a narrow silicon line;

depositing a gate electrode material over the narrow Si line;

polishing said gate electrode material, thereby forming an asymmetrical dual-gate; and completing fabrication of the semiconductor device.

2. A method as recited in claim 1, further comprising patterning an active region of a silicon-on-insulator (SOI) structure with a first photoresist layer.

3. A method as recited in claim 1, further comprising:

initiating formation of a sandwich fin structure from an SOI structure; and completing formation of the sandwich fin structure.

4. A method as recited in claim 3, further comprising depositing a thick gate material layer on the sandwich fin structure.

5. A method as recited in claim 3, wherein the sandwich fin structure comprises said narrow silicon (Si) line being sandwiched by silicon-germanium (SiGe).

6. A method as recited in claim 3, wherein the SOI structure comprises:
   a silicon dioxide ($SiO_2$) layer;
   a silicon (Si) layer deposited on the $SiO_2$ layer; and
   a silicon nitride ($Si_3N_4$) layer deposited on the Si layer.

7. A method as recited in claim 6, wherein the initiating formation of a sandwich fin structure step comprises:
   etching through the $Si_3N_4$ layer and the Si layer, thereby forming a $Si_3N_4$/Si stack, the $Si_3N_4$/Si stack comprising a $Si_3N_4$ cap layer and a reduced width Si layer, wherein the $Si_3N_4$/Si stack has a height in a range of approximately 800 Angstroms to approximately 1500 Angstroms; and
   further etching the reduced width Si layer by wet-etching, thereby forming a narrow line, comprising Si, under the $Si_3N_4$ cap layer.

8. A method as recited in claim 6, wherein the completing formation of a sandwich fin structure step further comprises depositing a thin gate dielectric layer on the epitaxial layer, the cap layer, and any exposed portion of the $SiO_2$ layer, wherein the thin gate dielectric layer comprises a high dielectric constant material such as silicon nitride ($Si_3N_4$).

9. A method as recited in claim 4, wherein the thick gate material layer has a thickness in a range of approximately 3000 Angstroms to approximately 6000 Angstroms.

10. A method as recited in claim 4, wherein the thick gate material layer comprises a material selected from a group consisting essentially of polysilicon (poly-Si), polysilicon-germanium (poly-SiGe), and a metal.

11. A method as recited in claim 1, wherein forming the said asymmetrical dual-gate comprises:
   polishing the gate material, thereby forming a polished gate material, whereby the $Si_3N_4$ cap layer acts as a polishing-stop, wherein the polishing step may be performed by a technique such as chemical-mechanical polishing (CMP);
   patterning the polished gate material with a second photoresist;
   etching the patterned polished gate material, thereby forming a pair of asymmetrical gate electrodes; and
   completing processing of the asymmetrical gate electrodes, thereby forming the asymmetrical dual-gate, wherein each gate of the asymmetrical dual-gate is separated by the $Si_3N_4$ cap layer.

12. A method as recited in claim 1,
   wherein completing fabrication of the device comprises forming a source/drain structure,
   wherein the source/drain structure is disposed adjacent to the sandwich fin structure, and
   wherein the asymmetrical dual-gate flanks the sandwich fin structure and is disposed approximately 90° from the source/drain structure.

13. A method of fabricating a semiconductor device, having an asymmetrical dual-gate MOSFET with a silicon-germanium (SiGe) channel, comprising:
   patterning an active region of a silicon-on-insulator (SOI) structure with a first photoresist layer;
   forming an epitaxial SiGe on at least one sidewall of a narrow silicon line;
   depositing a gate electrode material;
   polishing said gate electrode material, thereby forming an asymmetrical dual-gate; and
   completing fabrication of the semiconductor device.

14. A method as recited in claim 13, further comprising:
   initiating formation of a sandwich fin structure from an SOI structure; and
   completing formation of the sandwich fin structure,
   wherein the sandwich fin structure comprises said narrow silicon (Si) line being sandwiched by silicon-germanium (SiGe),
   wherein the initiating formation of a sandwich fin structure step comprises:
      etching through the $Si_3N_4$ layer and the Si layer, thereby forming a $Si_3N_4$/Si stack, the $Si_3N_4$/Si stack comprising a $Si_3N_4$ cap layer and a reduced width Si layer, wherein the $Si_3N_4$/Si stack has a height in a range of approximately 800 Angstroms to approximately 1500 Angstroms; and
      further etching the reduced width Si layer by wet-etching, thereby forming a narrow line, comprising Si, under the $Si_3N_4$ cap layer, and
   wherein the completing formation of a sandwich fin structure step comprises:
      forming an epitaxial layer, comprising silicon-germanium (SiGe), on the at least one sidewall of the narrow Si line; and
      depositing a thin gate dielectric layer on the epitaxial layer, the cap layer, and any exposed portion of the $SiO_2$ layer, wherein the thin gate dielectric layer comprises a high dielectric constant material such as $Si_3N_4$.

15. A method as recited in claim 14, further comprising depositing a thick gate material layer on the sandwich fin structure.

16. A method as recited in claim 15, wherein the SOI structure of step (a) comprises:
   a silicon dioxide ($SiO_2$) layer;
   a silicon (Si) layer deposited on the $SiO_2$ layer; and
   a silicon nitride ($Si_3N_4$) layer deposited on the Si layer.

17. A method as recited in claim 16, wherein the thick gate material layer has a thickness in a range of approximately 3000 Angstroms to approximately 6000 Angstroms.

18. A method as recited in claim 17, wherein the thick gate material layer comprises a material selected from a group consisting essentially of polysilicon (poly-Si), polysilicon-germanium (poly-SiGe), and a metal.

19. A method as recited in claim 18,
   wherein forming said asymmetrical dual-gate comprises:
      polishing the gate material, thereby forming a polished gate material, whereby the $Si_3N_4$ cap layer acts as a polishing-stop, wherein the polishing step may be performed by a technique such as chemical-mechanical polishing (CMP);
      patterning the polished gate material with a second photoresist;
      etching the patterned polished gate material, thereby forming a pair of asymmetrical gate electrodes; and
      completing processing of the asymmetrical gate electrodes, thereby forming the asymmetrical dual-gate, wherein each gate of the asymmetrical dual-gate is separated by the $Si_3N_4$ cap layer, and
   wherein completing fabrication of the device comprises forming a source/drain structure,
      wherein the source/drain structure is disposed adjacent to the sandwich fin structure, and
      wherein the asymmetrical dual-gate flanks the sandwich fin structure and is disposed approximately 90° from the source/drain structure.

* * * * *